(12) United States Patent
Tsukada et al.

(10) Patent No.: US 11,915,921 B2
(45) Date of Patent: Feb. 27, 2024

(54) ELECTRON SOURCE, METHOD FOR MANUFACTURING SAME, EMITTER, AND DEVICE INCLUDING SAME

(71) Applicant: Denka Company Limited, Tokyo (JP)

(72) Inventors: Dai Tsukada, Tokyo (JP); Hiromitsu Chatani, Tokyo (JP); Daisuke Ishikawa, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 17/996,469

(22) PCT Filed: Apr. 14, 2021

(86) PCT No.: PCT/JP2021/015465
§ 371 (c)(1),
(2) Date: Oct. 18, 2022

(87) PCT Pub. No.: WO2021/215330
PCT Pub. Date: Oct. 28, 2021

(65) Prior Publication Data
US 2023/0215679 A1 Jul. 6, 2023

(30) Foreign Application Priority Data
Apr. 21, 2020 (JP) .................. 2020-075321

(51) Int. Cl.
*H01J 9/04* (2006.01)
*H01J 1/16* (2006.01)
*H01J 37/063* (2006.01)

(52) U.S. Cl.
CPC ............... *H01J 9/042* (2013.01); *H01J 1/16* (2013.01); *H01J 37/063* (2013.01)

(58) Field of Classification Search
CPC .. H01J 1/16; H01J 37/063; H01J 1/148; H01J 2201/196; H01J 2237/06308; H01J 9/04;
(Continued)

(56) References Cited

U.S. PATENT DOCUMENTS 4,482,839 A * 11/1984 Wada .................. H01J 9/04
445/51
8,952,605 B2 * 2/2015 Zhang .................. H01J 9/025
313/458
(Continued)

FOREIGN PATENT DOCUMENTS

EP    2 680 294 A1    1/2014
JP    S63-32846 A    2/1988
(Continued)

OTHER PUBLICATIONS

Japan Patent Office, International Search Report issued in International Application No. PCT/JP2021/015465 dated Jul. 13, 2021.
(Continued)

*Primary Examiner* — Zheng Song
*Assistant Examiner* — Glenn Zimmerman
(74) *Attorney, Agent, or Firm* — Leydig, Voit & Mayer, Ltd.

(57) ABSTRACT

An electron source according to the present disclosure includes a columnar portion made of a first material having an electron emission characteristic; and a tubular portion that is disposed to surround the columnar portion and made of a second material having a higher work function than the first material, wherein a hole that extends in a direction from one end face toward the other end face and has a substantially circular cross-sectional shape is formed in the tubular portion, and the columnar portion has a substantially triangular or substantially quadrangular cross-sectional shape and is fixed to the tubular portion in an abutting engagement with an inner surface of the hole.

6 Claims, 8 Drawing Sheets

(58) Field of Classification Search
CPC ...... H01J 9/042–047; H01J 9/02; H01J 9/022; H01J 1/13; H01J 1/15–28
See application file for complete search history.

(56) References Cited

U.S. PATENT DOCUMENTS

| | | |
|---|---|---|
| 2009/0324324 A1 | 12/2009 | Hashimoto et al. |
| 2014/0055025 A1* | 2/2014 | Yasuda ............... H01J 1/26 313/364 |
| 2019/0221399 A1 | 7/2019 | Morishita et al. |
| 2019/0385809 A1* | 12/2019 | Kusunoki ............ H01J 1/18 |
| 2022/0051866 A1* | 2/2022 | Yasuda ............... H01J 35/064 |

FOREIGN PATENT DOCUMENTS

| | | | | |
|---|---|---|---|---|
| JP | 2012-069364 A | 4/2012 | | |
| JP | 2013-246917 A | 12/2013 | | |
| JP | 5525104 B2 * | 6/2014 | ............ | B82Y 10/00 |
| JP | 5525104 B2 | 6/2014 | | |
| JP | 6002989 B2 * | 10/2016 | | |
| WO | WO 2012/114521 A1 | 8/2012 | | |
| WO | WO-2018016286 A1 * | 1/2018 | ............ | H01J 1/148 |

OTHER PUBLICATIONS

European Patent Office, Extended European Search Report issued in European Patent Application No. 21793004.9 dated Jun. 6, 2023.
The International Bureau of WIPO, International Preliminary Report on Patentability issued in International Application No. PCT/JP2021/015465 dated Nov. 3, 2022.

* cited by examiner

ELECTRON SOURCE, METHOD FOR MANUFACTURING SAME, EMITTER, AND DEVICE INCLUDING SAME

CROSS-REFERENCE TO RELATED APPLICATIONS

This patent application is the U.S. national phase of International Application No. PCT/JP2021/015465, filed on Apr. 14, 2021, which claims the benefit of Japanese Patent Application No. 2020-075321, filed Apr. 21, 2020, the disclosures of which are incorporated herein by reference in their entireties for all purposes.

TECHNICAL FIELD

The present disclosure relates to an electron source, a method for manufacturing the same, an emitter, and a device provided with the same.

BACKGROUND ART

An emitter provided with an electron source is used, for example, in an electron microscope and a semiconductor inspection device. An emitter disclosed in Patent Literature 1 has a first member having an electron emission characteristic and a second member covering the first member, and a groove having a predetermined size is provided between the first member and the second member. An electron gun disclosed in Patent Literature 2 includes an electron gun cathode and a holder holding the electron gun cathode, the electron gun cathode has a quadrangular flat surface at a tip thereof, and a tip portion thereof is exposed and protrudes from the holder (see FIG. 6 of Patent Literature 2).

CITATION LIST

Patent Literature

[Patent Literature 1] Japanese Unexamined Patent Publication No. 2012-69364
[Patent Literature 2] Japanese Patent No. 5525104

SUMMARY OF INVENTION

Technical Problem

An electron source is extremely minute. Paragraph [0055] of Patent Literature 2 describes that a size of the electron gun cathode is 50 μm×50 μm×100 μm. A skilled technique is required to manufacture an electron source (electron gun) configured of such a minute component.

The present disclosure provides a method for manufacturing an electron source that is useful for efficiently manufacturing a minute electron source. In addition, the present disclosure provides an electron source and an emitter provided with the electron source, which can sufficiently prevent a member emitting electrons from coining off a member holding it. Further, the present disclosure provides a device provided with the emitter.

Solution to Problem

A method for manufacturing an electron source according to one aspect of the present disclosure includes the steps of: (A) preparing a plurality of first members each provided with a columnar portion made of a first material having an electron emission characteristic; (B) preparing a plurality of second members each of which has a higher work function than the first material, and in each of which a hole extending in a direction from one end face toward the other end face is formed; (C) selecting one first member from the plurality of first members and selecting one second member from the plurality of second members; and (D) pressing the columnar portion of the selected first member into the hole of the selected second member, wherein each of the columnar portions of the plurality of first members has a substantially quadrangular cross-sectional shape, each of the holes of the plurality of second members has a substantially circular cross-sectional shape, in the step (C), a set of the first member and the second member satisfying the following condition is selected from the plurality of first members and the plurality of second members, and in the step (D), by pressing the columnar portion into the hole of the second member, a portion of a side surface of the columnar portion abuts an inner surface of the hole of the second member, thereby fixing the columnar portion to the second member.
<Condition>

$$L_1/R_1 > 1 \qquad (1)$$

In the inequality (1), $L_1$ indicates a length of the longer one of two diagonals of the substantially quadrangular shape, and $R_1$ indicates a diameter of the hole.

According to the above manufacturing method, by selecting the first member and the second member that match each other in size from among the plurality of members in the step (C) and using these to perform the step (D), as described above, the portion of the side surface of the columnar portion abuts the inner surface of the hole of the second member, and the columnar portion can be fixed to the second member. For this reason, loss of members can be sufficiently reduced in manufacturing the electron source. That is, it is possible to sufficiently reduce manufacturing defects caused by mismatching in size between the columnar portion and the hole. Such defects include, for example, the columnar portion of the first member not entering the hole of the second member, the columnar portion not abutting the inner surface of the hole thereby coining off the hole, and the like.

The cross-sectional shapes of the columnar portions of the first members are not limited to the substantially quadrangular shape and may be substantially triangular shapes. In this case, in the above step (C), a set of the first member and the second member that satisfy the following condition may be selected from the plurality of first members and the plurality of second members.
<Condition>

A diameter $R_2$ of a circumscribed circle of a substantial triangle is larger than a diameter $R_1$ of the hole and when the substantial triangle is disposed in a circle having the same diameter as the diameter $R_1$ of the hole, at least two corners of the substantial triangle come into contact with the circle.

An electron source according to one aspect of the present disclosure is provided with a columnar portion made of a first material having an electron emission characteristic, and a tubular portion that is disposed to surround the columnar portion and made of a second material having a higher work function than the first material, wherein a hole that extends in a direction from one end face toward the other end face and has a substantially circular cross-sectional shape is formed in the tubular portion, and the columnar portion has a substantially triangular or substantially quadrangular cross-sectional shape and is fixed to the tubular portion in an abutting engagement with an inner surface of the hole.

According to the above electron source, it is possible to sufficiently inhibit the member (columnar portion) emitting electrons from coining off the member (tubular portion) holding it. A flat surface is preferably formed at a tip portion of the electron source by an electron emission surface of the columnar portion and an end face of the tubular portion. By forming such a flat surface, it is possible to sufficiently inhibit side emission of electrons.

An emitter according to one aspect of the present disclosure is provided with the electron source. A device according to one aspect of the present disclosure is provided with the emitter. Examples of the device provided with the emitter include, for example, an electron microscope, a semiconductor manufacturing device, and an inspection device.

Advantageous Effects of Invention

According to the present disclosure, a method for manufacturing an electron source that is useful for efficiently manufacturing a minute electron source is provided. In addition, according to the present disclosure, an electron source and an emitter provided with the electron source that can sufficiently inhibit a member emitting electrons from coining off a member holding it are provided. Further, according to the present disclosure, a device provided with the emitter is provided.

DESCRIPTION OF EMBODIMENTS

Figure 1:
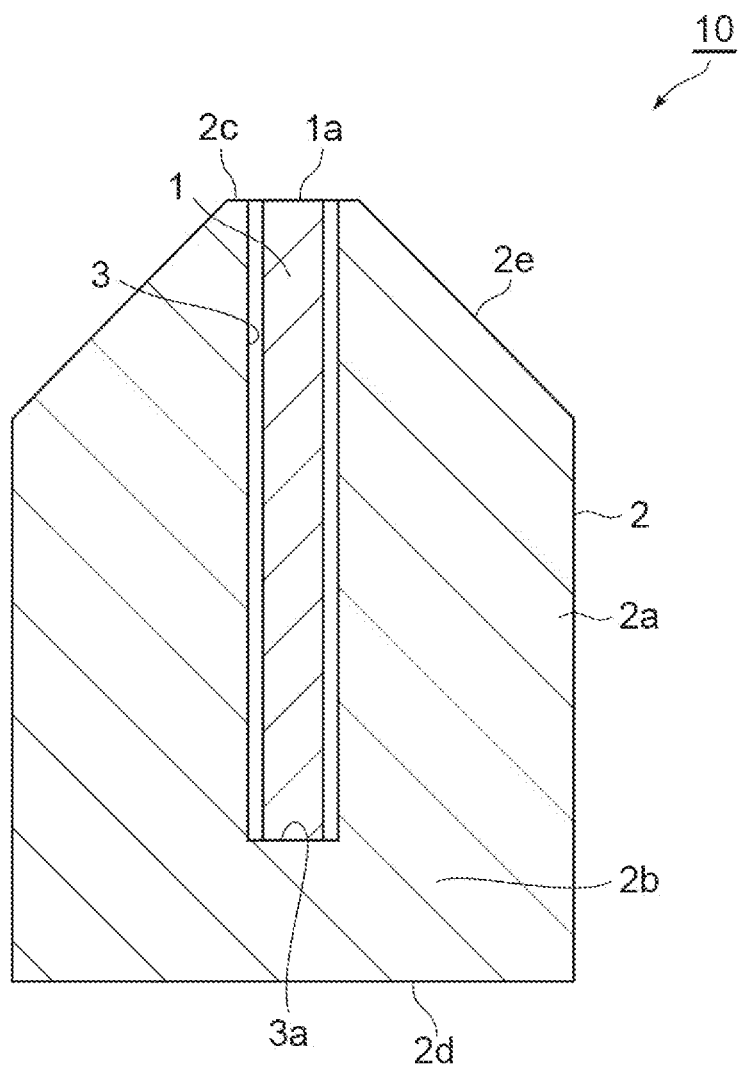
FIG. 1 is a cross-sectional view schematically showing one embodiment of an electron source according to the present disclosure.

Embodiments of the present disclosure will be described below with reference to the drawings. In the following description, the same reference numerals will be used for the same elements or elements having the same functions, and repeated description thereof will be omitted. Also, the present invention is not limited to the following embodiments.

<Electron Source>

Figure 2:
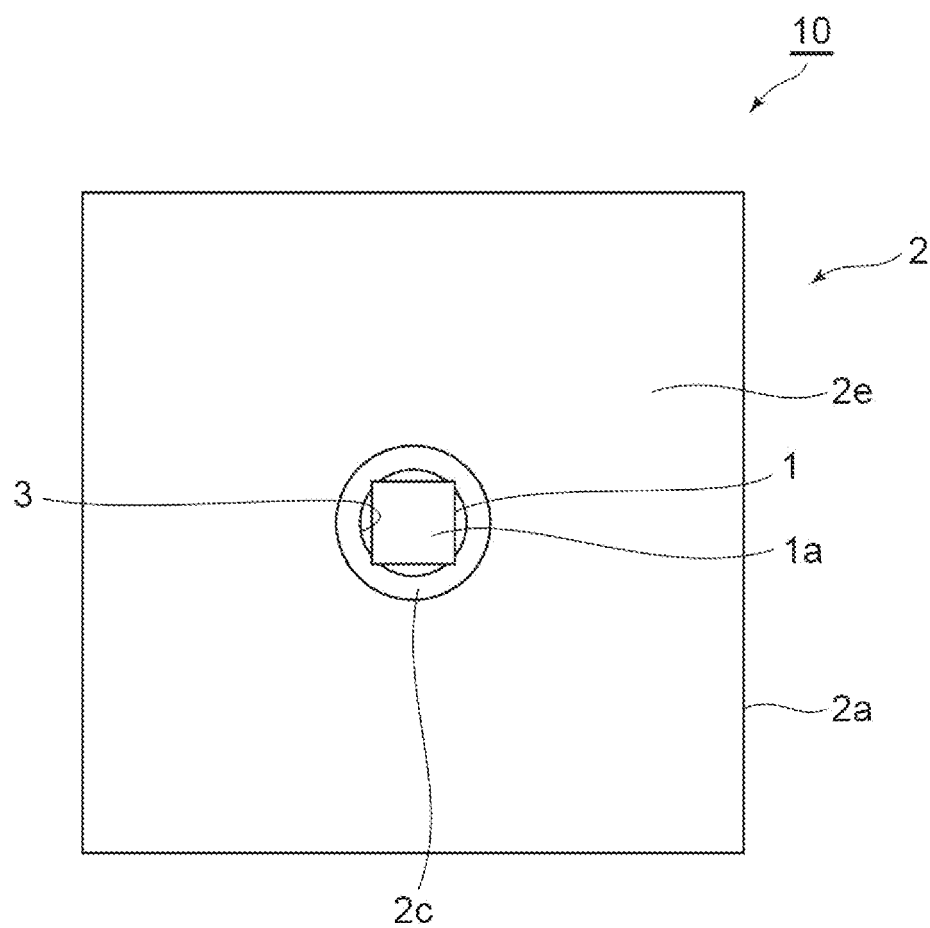
FIG. 2 is a plan view showing a configuration of a tip of the electron source shown in FIG. 1.

FIG. 1 is a cross-sectional view schematically showing an electron source according to the present embodiment. FIG. 2 is a plan view showing a configuration of a tip of the electron source 10 shown in FIG. 1. The electron source 10 is provided with a columnar portion 1 and an electron emission limiting member 2 disposed to surround the columnar portion 1. The columnar portion 1 is made of a first material (an electron emission material) having an electron emission characteristic. An end face 1a of the columnar portion 1 is an electron emission surface, and a normal line thereof is in an electron emission direction. On the other hand, the electron emission limiting member 2 is made of a second material (an electron emission limiting material) having a larger work function than the first material. The electron emission limiting member 2 has a tubular portion 2a in which a hole 3 is formed and a base end portion 2b in which the hole 3 is not formed. The base end portion 2b forms a bottom 3a of the hole 3. The hole 3 extends in a direction from an end face 2c toward the other end face 2d of the electron emission limiting member 2. In the present embodiment, an opening area of the hole 3 is constant from the end face 2c toward the end face 2d.

As shown in FIG. 2, the columnar portion 1 has a cross-sectional shape dissimilar to a cross-sectional shape of the hole 3 of the electron emission limiting member 2 and is fixed to the electron emission limiting member 2 in an abutting engagement with an inner surface of the hole 3. In the present embodiment, in a cross-section orthogonal to a longitudinal direction of the columnar portion 1, a shape of the columnar portion 1 is substantially square, and a shape of the hole 3 is substantially circular. In the present embodiment, a strength of the columnar portion 1 is assumed to be higher than a strength of the tubular portion 2a, and a portion of a side surface of the columnar portion 1 is fixed to the tubular portion 2a in a biting engagement therewith. According to the electron source 10, it is possible to sufficiently inhibit the columnar portion 1 from coining off from the electron emission limiting member 2. Also, in a case in which the strength of the columnar portion 1 is lower than the strength of the tubular portion 2a, corners of the first member 11 are ground and rounded, and the corners abut the inner surface of the hole 13 to fix the columnar portion 1 to the electron emission limiting member 2.

A flat surface is formed on a tip face of the electron source 10 by the end face 1a (electron emission surface) of the columnar portion 1 and the end face 2c of the electron emission limiting member 2. Further, the entire side surface of the columnar portion 1 is covered with the tubular portion 2a. Since the columnar portion 1 does not protrude from the tubular portion 2a in this way, it is possible to sufficiently inhibit unnecessary emission of electrons, that is, side emission of electrons. For example, in order to obtain electrons with a larger current, a tip portion of the electron source 10 is heated to a high temperature of about 1550° C. and a high electric field of several kV is applied to the electron source 10. When such a high electric field is applied, surplus electrons may be generated from portions other than the tip portion of the electron source. Due to the space-charge effect, the surplus electrons may reduce brightness of an electron beam from the tip portion and may cause unnecessary heating of peripheral electrode components. In order to prevent this, by exposing only the electron emission portion (end face 1a of the columnar portion 1) of the electron source 10 and covering other surfaces with the tubular portion 2a, only a high-brightness electron beam from the tip portion can be obtained. Also, the term "flat surface" used herein means that a difference in level between the end face 1a and the end face 2c is less than 2 μm. As long as this difference in level is less than 2 μm, the columnar portion 1 may protrude from the tubular portion 2a, or the end face 1a may be recessed from the end face 2c. This difference in level may be less than 1.5 μm or less than 1.0 μm.

By covering the entire side surfaces of the columnar portion 1 with the tubular portion 2a, the effect that occurrence of a phenomenon called a micro-discharge can be inhibited is also achieved. That is, in thermionic emission, electrons are emitted by heating an electron source to a high temperature. Along with this, when an electron emission material evaporates, it adheres to peripheral electrode components and forms fibrous crystals called whiskers. When charges are accumulated in the whiskers, micro-discharges are caused. The micro-discharges destabilize an electron beam and cause degradation of device performance. By covering the entire side surfaces of the columnar portion 1 with the tubular portion 2a, the sublimated electron emission material is trapped in the tubular portion 2a, which can reduce an amount of adhesion thereof to the peripheral electrode components and make the micro-discharges less likely to occur. Also, the tubular portion 2a covers the entire side surfaces of the columnar portion 1 without a gap partially in a circumferential direction thereof. Since the tubular portion 2a does not have any gap, side emission of electrons can be sufficiently inhibited.

(Electron Emission Material)

The columnar portion 1 is made of an electron emission material (a first material). An electron emission material is a material that emits electrons when heated. An electron emission material has a lower work function than an electron emission limiting material and a higher strength than an electron emission limiting material. Examples of the electron emission material may include rare earth borides such as lanthanum boride ($LaB_6$) and cerium boride ($CeB_6$); high melting point metals such as tungsten, tantalum, hafnium and their oxides, carbides and nitrides; and noble metal—rare earth alloys such as iridium cerium. Work functions of these materials are as follows:

Lanthanum boride ($LaB_6$): 2.8 eV
Cerium boride ($CeB_6$): 2.8 eV
Tantalum carbide: 3.2 eV
Hafnium carbide: 3.3 eV From the viewpoint of the electron emission characteristic, strength, and workability, the electron emission material forming the columnar portion 1 is preferably a rare earth boride. In a case in which the columnar portion 1 is made of a rare earth boride, the columnar portion 1 is preferably a single crystal machined such that the <100> orientation, which has a low work function and is likely to emit electrons, coincides with the electron emission direction. The columnar portion 1 can be formed into a desired shape by electrical discharge machining or the like. Since it is considered that an evaporation rate is slow on the side surfaces of the columnar portion 1, they are preferably (100) crystal planes.

In the present embodiment, a shape of the columnar portion 1 is a quadrangular prism (see FIGS. 1 and 2). A length of the columnar portion 1 is preferably 0.1 to 1 mm, more preferably 0.2 to 0.6 mm, and still more preferably about 0.3 mm. When the length is 0.1 mm or more, handling tends to be good, and when the length is 1 mm or less, cracks and the like tend to be less likely to occur. A cross-sectional shape of the columnar portion 1 is substantially square. Lengths of its sides are preferably 20 to 300 μm, more preferably 50 to 150 μm, and still more preferably about 100 μm.

(Electron Emission Limiting Material)

The electron emission limiting member 2 is made of an electron emission limiting material. An electron emission limiting material has a higher work function than an electron emission material. By covering the side surfaces of the columnar portion 1 with the electron emission limiting member 2, electron emission from the side surfaces of the columnar portion 1 is inhibited.

A difference ($\Delta W = W_2 - W_1$) between a work function $W2$ of the electron emission limiting member 2 and a work function $W1$ of the columnar portion 1 is preferably 0.5 eV or more, more preferably 1.0 eV or more, and still more preferably 1.6 eV or more.

The electron emission limiting material preferably contains a high melting point metal or carbides thereof, and preferably contains at least one of metal tantalum, metal titanium, metal zirconium, metal tungsten, metal molybdenum, metal rhenium, tantalum carbide, titanium carbide, and zirconium carbide. Also, the electron emission limiting material may include at least one of boron carbide and graphite (a carbon material). Also, the electron emission limiting material may include at least one of niobium, hafnium, and vanadium. Glassy carbon (for example, Glassy Carbon (trade name, manufactured by Reiho Manufacturing Co., Ltd.)) may be used for the electron emission limiting material. Work functions of these materials are as follows:

Metal rhenium: 4.9 eV
Boron carbide: 5.2 eV
Graphite: 5.0 eV

In the present embodiment, as described above, the strength of the electron emission limiting material is lower than that of the electron emission material. The strengths of both materials can be evaluated, for example, by Vickers hardness. From the viewpoint of proper strength and workability, the material constituting the electron emission limiting member 2 preferably has a Vickers hardness of about 100 HV to 1900 H V. For example, glassy carbon (having a Vickers hardness of about 230 HV) is suitable for the electron emission limiting material in that it has a moderate strength. A tip portion 2e (a portion of the tubular portion 2a) of the electron emission limiting member 2 is machined into a tapered shape, and the remaining portions (the remaining portion of the tubular portion 2a, and the base end portion 2b) are machined into a quadrangular prism shape. By machining the tip portion 2e of the electron emission limiting member 2 into a tapered shape, the effect that an electric field can be easily concentrated and electron emission efficiency can be improved is achieved. Also, a support member (not shown) may be provided around the electron emission limiting member 2.

The electron emission material and the electron emission limiting material may be appropriately selected, for example, from the viewpoint of their work functions and strengths and used in combination. Suitable examples of the electron emission material include lanthanum boride ($LaB_6$), cerium boride ($CeB_6$), hafnium carbide, and iridium cerium. Suitable examples of the electron emission limiting material include metallic rhenium, boron carbide, and graphite (including glassy carbon). Also, some materials that can be used for the electron emission material can also be used for the electron emission limiting material. For example, materials having a work function of about 3.2 to 4.5 eV can be used for both the electron emission material and the electron emission limiting material. Such materials include metal tungsten (having a work function of 4.5 eV), metal tantalum (having a work function of 3.2 eV), and hafnium carbide (having a work function of 3.3 eV).

<Method for Manufacturing Electron Source>

Next, a method for manufacturing the electron source 10 will be described. The electron source 10 is manufactured through the following steps.

(A) Preparing a plurality of columnar first members 11.

(B) Preparing a plurality of second members 12, each of which has a larger work function than the first member 11, and in each of which a hole 13 extending in a direction from one end face 12a toward the other end face 12b is formed.

(C) Selecting one first member 11 from the plurality of first members 11 and selecting one second member 12 from the plurality of second members 12.

(D) Pressing the selected first member 11 into the hole 13 of the selected second member 12.

In the above step (C), a set of the first member 11 and the second member 12 that satisfy the following condition is selected from the plurality of first members 11 and the plurality of second members 12. In the above step (D), by pressing the selected first member 11 into the hole 13 of the selected second member 12, a portion of a side surface of the first member 11 abuts the inner surface of the hole 13 of the second member 12, thereby fixing the first member 11 to the second member 12.

<Condition>

$$L_1/R_1 > 1 \tag{1}$$

Figure 5:
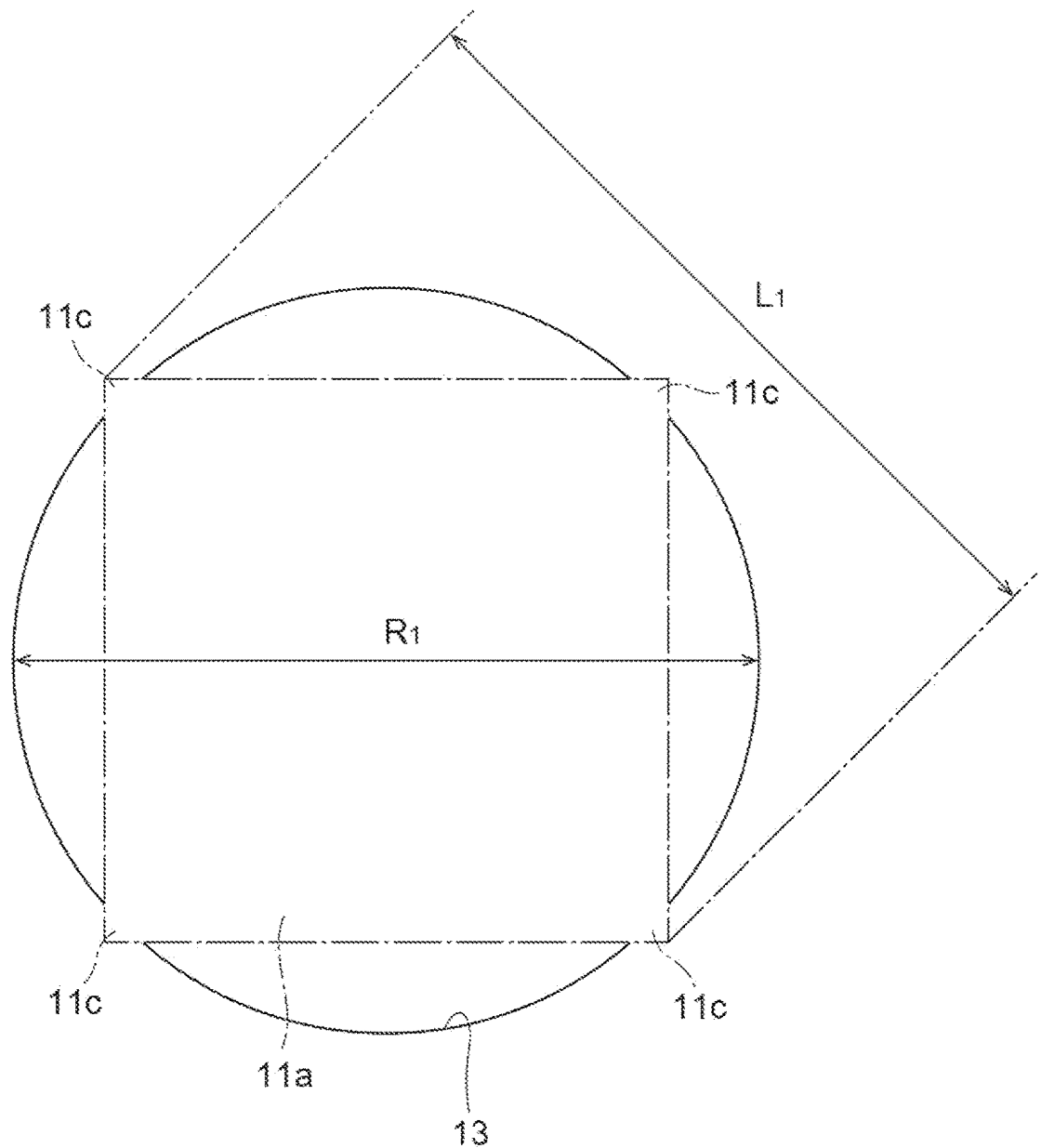
FIG. 5 is a plan view showing a relationship in size between the columnar portion (having a substantially square cross-sectional shape) of the first member and the hole of the second member.

In a case in which the strength of the first member 11 is higher than the strength of the second member 12, by pressing the first member 11 into the hole 13 of the second member 12, a portion of the side surface of the first member 11 scrapes the inner surface of the hole 13 and bites into the second member 12, whereby the first member 11 is fixed to the second member 12 (see FIG. 5). On the other hand, in a case in which the strength of the first member 11 is lower than the strength of the second member 12, by pressing the first member 11 into the hole 13 of the second member 12, the corners of the first member 11 are ground and rounded, and the corners abuts the inner surface of the hole 13 to fix the first member 11 to the second member 12. In addition, the strength of the first member 11 and the second member 12 can be evaluated by Vickers strength, for example.

Figure 3A:
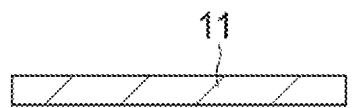
FIG. 3A is a cross-sectional view schematically showing a first member provided with a columnar portion.
Figure 3B:
FIG. 3B is a plan view showing a tip portion of the first member shown in FIG. 3A.

The first member 11 shown in FIGS. 3A and 3B is made of an electron emission material. The first member 11 can be obtained by electrical discharge machining or the like from a block of the electron emission material. The first member 11 is a portion serving as the columnar portion 1 of the electron source 10.

Figure 3C:
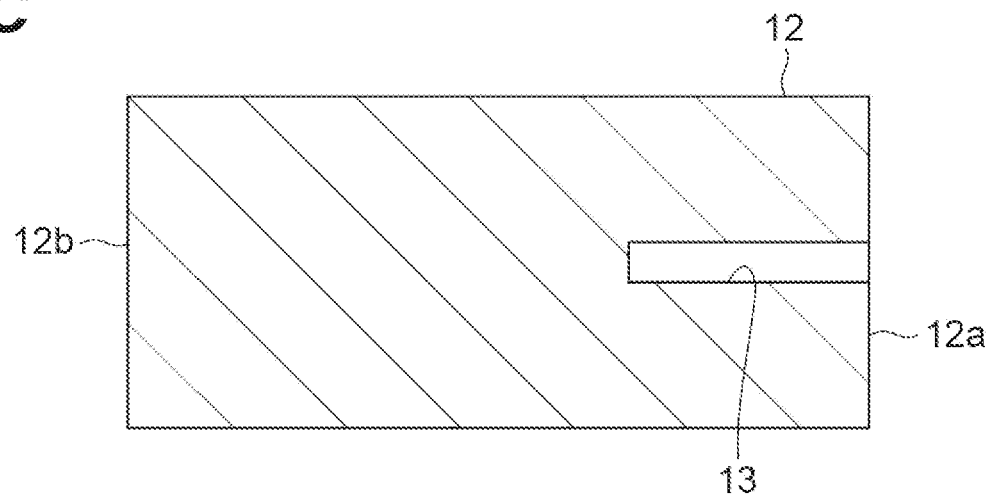
FIG. 3C is a cross-sectional view schematically showing a second member in which a hole is formed.

The second member 12 shown FIG. 3C is made of an electron emission limiting material. The second member 12 may be obtained by electrical discharge machining or the like from a block of the electron emission limiting material. The hole 13 of the second member 12 is a portion serving as the hole 3 of the electron source 10. An opening area of the hole 13 is constant from the end face 12a toward the end face 12b.

Figure 4A:
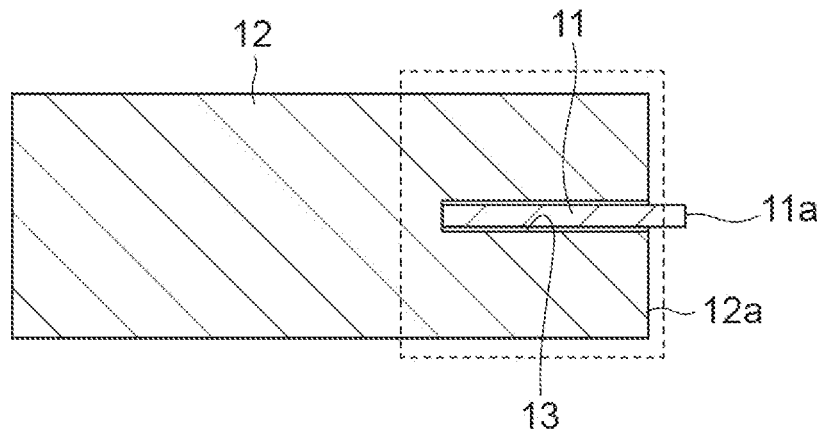
FIG. 4A to 4C are cross-sectional views schematically showing a process of manufacturing the electron source shown in FIG. 1.

FIG. 4A is a cross-sectional view schematically showing a state in which the first member 11 is pressed into the hole 13 of the second member 12. FIG. 5 is a plan view showing a relationship in size between the first member 11 and the hole 13 of the second member 12. Parts of the side surfaces of the first member 11 (four corners 11c) bite into the second member 12. Although FIG. 4A illustrates a state in which the first member 11 reaches deep into the hole 13, the first member 11 does not have to reach deep into the hole 13.

In the step (C), the second member 12 having the first member 11 and the hole 13 that satisfy the following condition are selected.

<Condition>

$$L_1/R_1 > 1 \tag{1}$$

In the inequality (1), $L_1$ indicates a length of a diagonal of a cross-section (substantially square) of the first member 11, and $R_1$ indicates a diameter of the hole 13.

A value of l/R' more preferably satisfies the inequality (1a), further preferably satisfies the inequality (1b), and particularly preferably satisfies the inequality (1c).

$$1 < L_1/R_1 < 1.2 \tag{1a}$$

$$1 < L_1/R_1 < 1.1 \tag{1b}$$

$$1 < L_1/R_1 < 1.05 \tag{1c}$$

Figure 4B:
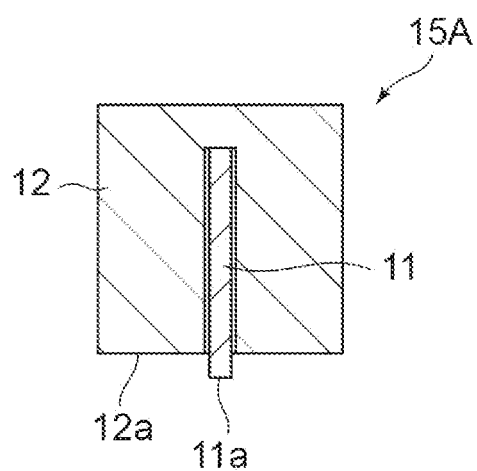
Figure 4C:
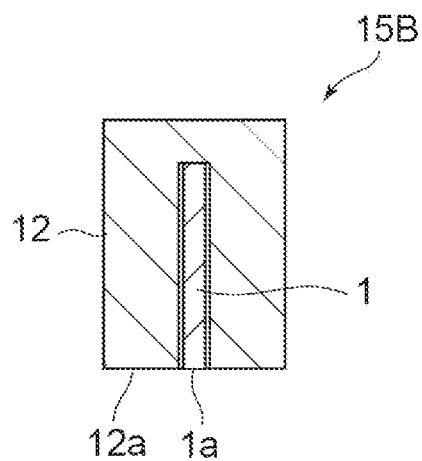

A structure 15A shown in FIG. 4B was obtained by cutting out the portion surrounded by the quadrangular-shaped broken line in FIG. 4A. In the structure 15A, the first member 11 protrudes from the end face 12a. by grounding a protruding portion 11a of the first member 11 with, for example, abrasive paper, the end face 1a (electron emission surface) is formed, and an outer side of the second member 12 is machined into a quadrangular prism shape. Thus, a quadrangular prism body 15B shown in FIG. 4C is obtained. The electron source 10 shown in FIG. 1 is obtained by tapering one end portion of the quadrangular prism body 15B. Also, an order of machining is not limited thereto, and for example, from the state shown in FIG. 4A, first, the protruding portion 11a may be cut to form a flat surface, and then the portion surrounded by the quadrangular-shaped broken line in FIG. 4A may be cut out. In addition, the shape of the second member 12 after machining is not limited to a quadrangular prism shape, and for example, in a substantially cylindrical electron source, only the portion sandwiched between heaters may be flattened (see FIG. 6).

According to the above manufacturing method, by selecting the first member 11 and the second member 12 that match each other in size from the plurality of members in the step (C) and performing the step (D) using these, loss of these members can be sufficiently reduced. That is, it is possible to sufficiently reduce manufacturing defects caused by mismatching in size between the first member 11 and the hole 13. Such defects include, for example, the first member 11 not entering the hole 13, the first member 11 not abutting the inner surface of the hole 13 thereby coining off the hole 13, and the like.

According to the above manufacturing method, by going through the step of cutting the protruding portion 11a of the first member 11, the flat surface is formed at the tip portion of the electron source 10 by the end face 1a (electron emission surface) of the columnar portion 1 and the end face 2c of the tubular portion 2a. Since the columnar portion 1 does not protrude from the tubular portion 2a, as described above, unnecessary emission of electrons, that is, side emission of electrons can be sufficiently inhibited, and microdischarges caused by generation of whiskers can also be inhibited.

<Emitter>

Figure 6:
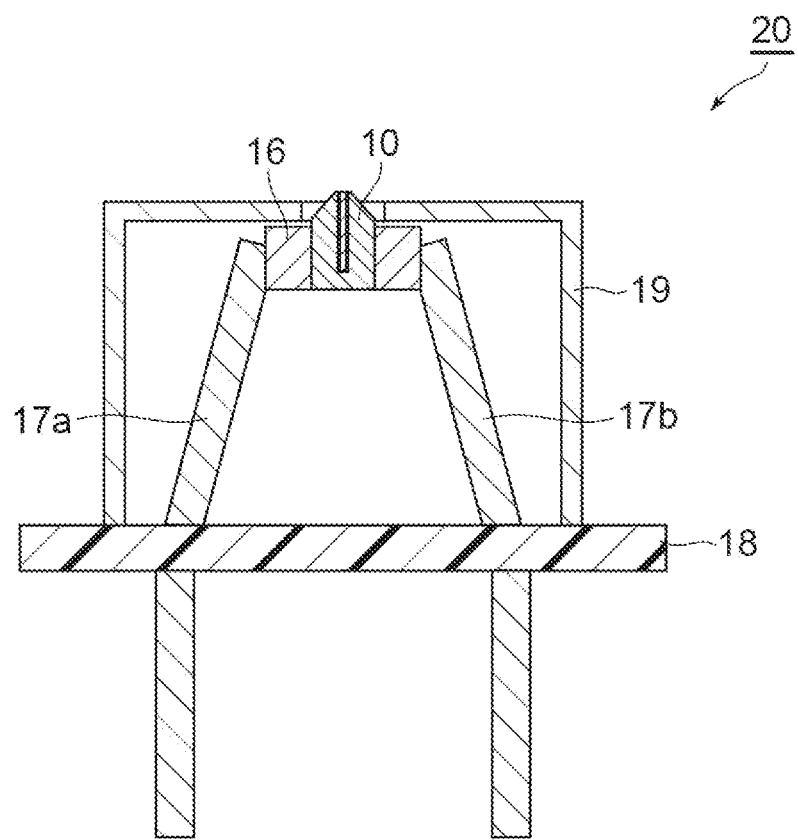
FIG. 6 is a cross-sectional view schematically showing one embodiment of an emitter according to the present disclosure.

FIG. 6 is a cross-sectional view schematically showing an example of an emitter. An emitter 20 shown in FIG. 6 is provided with the electron source 10, a carbon heater 16 disposed around the electron source 10, electrode pins 17a and 17b, an insulator 18, and a suppressor 19. The carbon heater 16 is for heating the electron source 10. The electrode pins 17a and 17b are for energizing the carbon heater 16. The suppressor 19 is for inhibiting a surplus current. Also, the electron source 10 may be configured to be heated by means other than the carbon heater 16.

Examples of devices provided with the emitter 20 include an electron microscope, a semiconductor manufacturing device, an inspection device, and a machining device.

Although the embodiment of the present disclosure has been described in detail above, the present invention is not limited to the above embodiment. For example, in the above embodiment, the columnar portion 1 having a substantially square cross-sectional shape has been illustrated (see FIGS. 1 and 2), but the cross-sectional shape of the columnar portion 1 may be substantially quadrangular other than substantially square, and for example, it may be substantially rectangular, substantially rhombic, or substantially parallelogram.

In a case in which the cross-sectional shape of the first member 11 is substantially quadrangular other than substantially square, the above $L_1/R_1$ shows the following values.

$L_1$: a length of a longer diagonal of two diagonals of the substantially quadrangular shape $R_1$: a diameter of the hole 13

In a case in which an electron source in which the columnar portion 1 has a substantially triangular cross-sectional shape is manufactured, the first member 11 and the hole 13 (second member 12) which satisfy the following condition are selected in the step (C).

<Condition>

Figure 7:
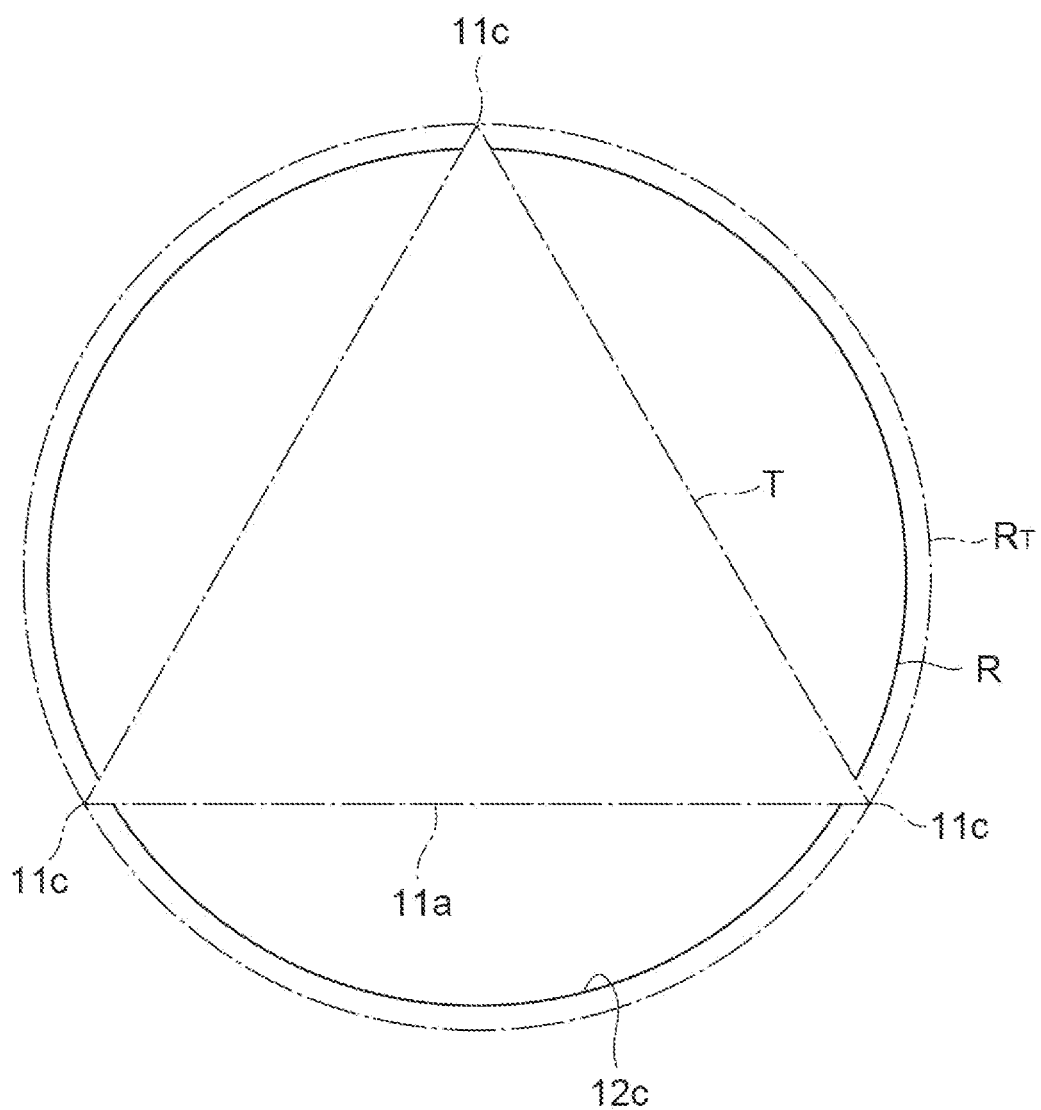
FIG. 7 is a plan view showing a relationship in size between the columnar portion (having a substantially triangular cross-sectional shape) of the first member and the hole of the second member.

A diameter $R_2$ of a circumscribed circle of the substantial triangle is larger than a diameter $R_1$ of the hole and when the substantial triangle is disposed in a circle having the same diameter as the diameter $R_1$ of the hole 13, at least two corners of the substantial triangle come into contact with the circle. In FIG. 7, a solid-line circle R is a circle having the diameter $R_1$, and a dashed-dotted line circle RT is a circumscribed circle of a substantial triangle T.

Figure 8A:
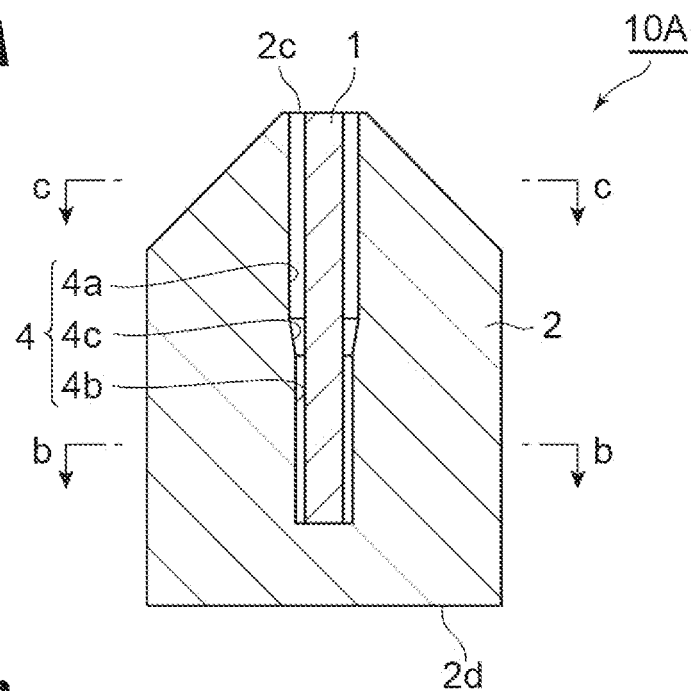
FIG. 8A is a cross-sectional view schematically showing another embodiment of the electron source according to the present disclosure.
Figure 8B:
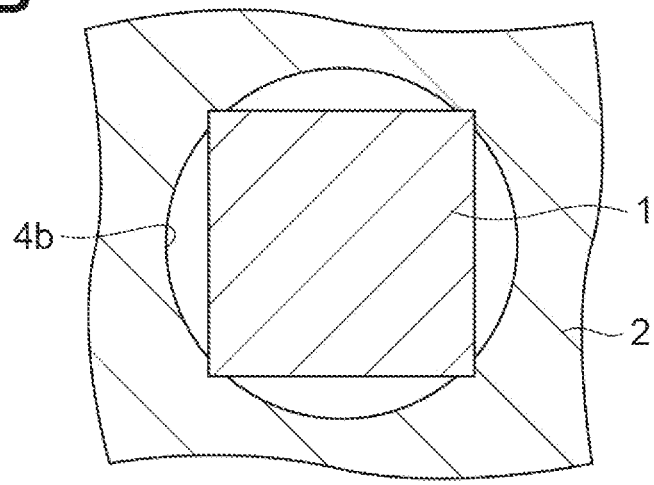
FIG. 8B is an enlarged cross-sectional view along line b-b in FIG. 8A.
Figure 8C:
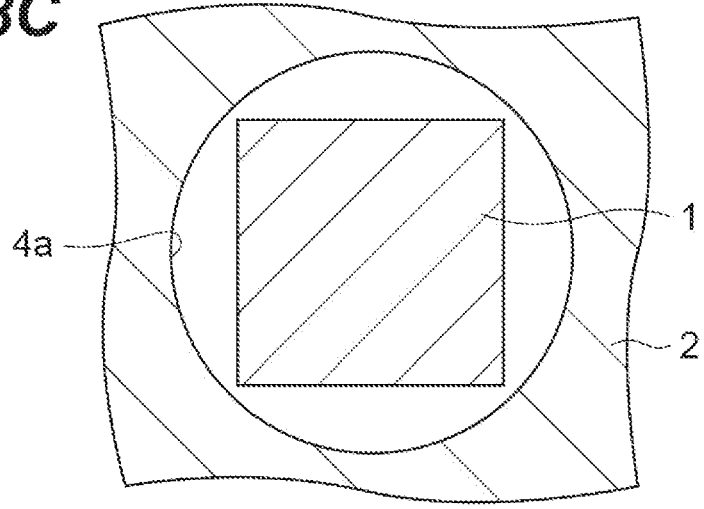
FIG. 8C is an enlarged cross-sectional view along line c-c in FIG. 8A.

In the above embodiment, the case in which the opening area of the hole 3 is constant in the extending direction has been illustrated, but the hole of the electron emission limiting member 2 may have a reduced diameter portion in which the opening area decreases from the end face 2c toward the end face 2d. An electron source 10A shown in FIG. 8A has the same configuration as the electron source 10 except for the shape of the hole. A hole 4 in the electron source 10A is configured of a hole 4a on the end face 2c side, a hole 4b on the end face 2d side, and a tapered portion 4c (reduced diameter portion) therebetween. An inner diameter of the hole 4b is smaller than an inner diameter of the hole 4a. In this case, as shown in FIG. 8B, as long as the columnar portion 1 scrapes an inner surface of the hole 4b and bites into the electron emission limiting member 2, thereby being sufficiently fixed, the columnar portion 1 may not bite into the electron emission limiting member 2 in the hole 4a, as shown in FIG. 8C. Also, although the tapered portion 4c in which the inner diameter continuously decreases has been illustrated as the reduced diameter portion here, the inner diameter of the reduced diameter portion may be reduced in stages. The hole of the second member 12 may similarly have a reduced diameter portion.

INDUSTRIAL APPLICABILITY

According to the present disclosure, the method for manufacturing an electron source that is useful for efficiently manufacturing a minute electron source is provided. Also, according to the present disclosure, the electron source and the emitter provided with the same, which can sufficiently inhibit the member emitting electrons from coining off the member holding it are provided. Further, according to the present disclosure, the device provided with the emitter is provided.

REFERENCE SIGNS LIST

1: Columnar portion, 1a: End face (electron emission surface), 2: Electron emission limiting member, 2a: Tubular portion, 2b: Base end portion, 2c: One end face, 2d: Other end face, 3, 4, 13: Hole, 4c: Tapered portion (reduced diameter portion), 10, 10A: Electron source, 11: First member (columnar portion), 11a: Protruding portion, 11c: Corner portion, 12: Second member, 20: Emitter

The invention claimed is:

1. A method for manufacturing an electron source comprising steps of:
   (a) preparing a plurality of first members each provided with a columnar portion made of a first material having an electron emission characteristic;
   (b) preparing a plurality of second members each of which has a higher work function than the first material, and in each of which a hole extending in a direction from one end face toward the other end face is formed;
   (c) selecting one first member from the plurality of first members and selecting one second member from the plurality of second members; and
   (d) pressing the columnar portion of the selected first member into the hole of the selected second member,
   wherein each of the columnar portions of the plurality of first members has a substantially quadrangular cross-sectional shape,
   each of the holes of the plurality of second members has a substantially circular cross-sectional shape,
   in step (c), a set of the first member and the second member satisfying the following condition is selected from the plurality of first members and the plurality of second members,
   in step (d), by pressing the columnar portion into the hole of the second member, a portion of a side surface of the columnar portion abuts an inner surface of the hole of the second member, thereby fixing the columnar portion to the second member, and
   the condition is such that $L_1$ and $R_1$ satisfy the following inequality (1):

$$L_1/R_1 > 1 \qquad (1),$$

wherein $L_1$ indicates a length of the longer one of two diagonals of the substantially quadrangular shape, and $R_1$ indicates a diameter of the hole.

2. An emitter comprising the electron source manufactured by the method for manufacturing an electron source according to claim 1.

3. A device comprising the emitter according to claim 2.

4. A method for manufacturing an electron source comprising steps of:
   (a) preparing a plurality of first members each provided with a columnar portion made of a first material having an electron emission characteristic;
   (b) preparing a plurality of second members each of which has a higher work function than the first material, and in each of which a hole extending in a direction from one end face toward the other end face is formed;
   (c) selecting one first member from the plurality of first members and selecting one second member from the plurality of second members; and (d) pressing the columnar portion of the selected first member into the hole of the selected second member, wherein each of the columnar portions of the plurality of first members has a substantially triangular cross-sectional shape, each of the holes of the plurality of second members has a substantially circular cross-sectional shape, in step (c), a set of the first member and the second member is selected from the plurality of first members and the plurality of second members under the following conditions, and in step (d), by pressing the columnar portion into the hole of the second member, a portion of a side surface of the columnar portion abuts an inner surface of the hole of the second member, thereby fixing the columnar portion to the second member, wherein the conditions are such that a diameter $R_2$ of a circumscribed circle of the substantial triangle is set larger than a diameter $R_1$ of the hole, and when the substantial triangle is disposed in a prepared circle having the same diameter as the diameter $R_1$ of the hole, at least two corners of the substantial triangle protrude into the prepared circle.

5. An emitter comprising an electron source manufactured by the method according to claim 4.

6. A device comprising the emitter according to claim 5.

* * * * *